United States Patent
Dadashev (10) Patent No.: US 7,221,138 B2
(45) Date of Patent: May 22, 2007

(54) METHOD AND APPARATUS FOR MEASURING CHARGE PUMP OUTPUT CURRENT

(75) Inventor: Oleg Dadashev, Hadera (IL)

(73) Assignee: Saifun Semiconductors Ltd, Netanya (IL)

( * ) Notice: Subject to any disclaimer, the term of this patent is extended or adjusted under 35 U.S.C. 154(b) by 0 days.

(21) Appl. No.: 11/236,360

(22) Filed: Sep. 27, 2005

(65) Prior Publication Data

US 2007/0069714 A1   Mar. 29, 2007

(51) Int. Cl.
G01R 19/00 (2006.01)
H01L 29/94 (2006.01)

(52) U.S. Cl. .................. 324/76.11; 257/299; 257/713

(58) Field of Classification Search ............ 324/76.11; 257/299
See application file for complete search history.

(56) References Cited

U.S. PATENT DOCUMENTS

| | | |
|---|---|---|
| 3,881,180 A | 4/1975 | Gosney, Jr. |
| 3,895,360 A | 7/1975 | Cricchi et al. |
| 3,952,325 A | 4/1976 | Beale et al. |
| 4,016,588 A | 4/1977 | Ohya et al. |
| 4,017,888 A | 4/1977 | Christie et al. |
| 4,145,703 A | 3/1979 | Blanchard et al. |
| 4,151,021 A | 4/1979 | McElroy |
| 4,173,766 A | 11/1979 | Hayes |
| 4,173,791 A | 11/1979 | Bell |
| 4,247,861 A | 1/1981 | Hsu et al. |
| 4,257,832 A | 3/1981 | Schwabe et al. |
| 4,281,397 A | 7/1981 | Neal et al. |
| 4,306,353 A | 12/1981 | Jacobs et al. |
| 4,342,102 A | 7/1982 | Puar |
| 4,342,149 A | 8/1982 | Jacobs et al. |
| 4,360,900 A | 11/1982 | Bate |
| 4,373,248 A | 2/1983 | McElroy |
| 4,380,057 A | 4/1983 | Kotecha et al. |
| 4,388,705 A | 6/1983 | Sheppard |
| 4,389,705 A | 6/1983 | Sheppard |
| 4,404,747 A | 9/1983 | Collins |

(Continued)

FOREIGN PATENT DOCUMENTS

EP        0 656 628        6/1995

(Continued)

OTHER PUBLICATIONS

U.S. Appl. No. 08/902,890, filed Jul. 30, 1997, Eitan.

(Continued)

Primary Examiner—Andrew H. Hirshfeld
Assistant Examiner—John Zhu
(74) Attorney, Agent, or Firm—Eitan Law Group (57) ABSTRACT

A method for measuring output current of a charge pump, the method including providing a charge pump including a plurality of n charge pump stages, wherein an output of stage n−1 ($Vo_{n-1}$) is output to stage n, an output voltage of stage n being referred to as charge pump voltage output Vout, connecting an additional output pass device to the output of stage n−1, an output voltage of the additional output pass device being referred to as Voutm, forcing Voutm to be at least approximately equal to Vout, drawing at least one of output voltage (Voutm) and output current (Ioutm) from the additional output pass device, measuring Ioutm (e.g., comparing Ioutm with a reference current), and correlating Iout with Ioutm.

22 Claims, 4 Drawing Sheets

U.S. PATENT DOCUMENTS

| | | |
|---|---|---|
| 4,435,786 A | 3/1984 | Tickle |
| 4,448,400 A | 5/1984 | Harari |
| 4,471,373 A | 9/1984 | Shimizu et al. |
| 4,494,016 A | 1/1985 | Ransom et al. |
| 4,507,673 A | 3/1985 | Aoyama |
| 4,521,796 A | 6/1985 | Rajkanan et al. |
| 4,527,257 A | 7/1985 | Cricchi |
| 4,586,163 A | 4/1986 | Koike |
| 4,613,956 A | 9/1986 | Paterson et al. |
| 4,630,085 A | 12/1986 | Koyama |
| 4,663,645 A | 5/1987 | Komori et al. |
| 4,665,426 A | 5/1987 | Allen et al. |
| 4,667,217 A | 5/1987 | Janning |
| 4,672,409 A | 6/1987 | Takei et al. |
| 4,725,984 A | 2/1988 | Ip et al. |
| 4,733,105 A | 3/1988 | Shin et al. |
| 4,742,491 A | 5/1988 | Liang et al. |
| 4,758,869 A | 7/1988 | Eitan et al. |
| 4,760,555 A | 7/1988 | Gelsomini et al. |
| 4,761,764 A | 8/1988 | Watanabe |
| 4,769,340 A | 9/1988 | Chang et al. |
| 4,780,424 A | 10/1988 | Holler et al. |
| 4,839,705 A | 6/1989 | Tigelaar et al. |
| 4,847,808 A | 7/1989 | Kobatake |
| 4,857,770 A | 8/1989 | Partovi et al. |
| 4,870,470 A | 9/1989 | Bass, Jr. et al. |
| 4,916,671 A | 4/1990 | Ichiguchi |
| 4,941,028 A | 7/1990 | Chen et al. |
| 4,961,010 A | 10/1990 | Davis |
| 4,992,391 A | 2/1991 | Wang |
| 5,021,999 A | 6/1991 | Kohda et al. |
| 5,027,321 A | 6/1991 | Park |
| 5,029,063 A | 7/1991 | Lingstaedt et al. |
| 5,042,009 A | 8/1991 | Kazerounian et al. |
| 5,075,245 A | 12/1991 | Woo et al. |
| 5,081,371 A | 1/1992 | Wong |
| 5,086,325 A | 2/1992 | Schumann et al. |
| 5,094,968 A | 3/1992 | Schumann et al. |
| 5,104,819 A | 4/1992 | Freiberger et al. |
| 5,117,389 A | 5/1992 | Yiu |
| 5,120,672 A | 6/1992 | Mitchell et al. |
| 5,142,495 A | 8/1992 | Canepa |
| 5,142,496 A | 8/1992 | Van Buskirk |
| 5,159,570 A | 10/1992 | Mitchell et al. |
| 5,168,334 A | 12/1992 | Mitchell et al. |
| 5,172,338 A | 12/1992 | Mehrotra et al. |
| 5,175,120 A | 12/1992 | Lee |
| 5,204,835 A | 4/1993 | Eitan |
| 5,214,303 A | 5/1993 | Aoki |
| 5,237,213 A | 8/1993 | Tanoi |
| 5,241,497 A | 8/1993 | Komarek |
| 5,260,593 A | 11/1993 | Lee |
| 5,268,861 A | 12/1993 | Hotta |
| 5,276,646 A | 1/1994 | Kim et al. |
| 5,280,420 A | 1/1994 | Rapp |
| 5,289,412 A | 2/1994 | Frary et al. |
| 5,293,563 A | 3/1994 | Ohta |
| 5,295,092 A | 3/1994 | Hotta et al. |
| 5,295,108 A | 3/1994 | Higa |
| 5,305,262 A | 4/1994 | Yoneda |
| 5,311,049 A | 5/1994 | Tsuruta |
| 5,315,541 A | 5/1994 | Harari et al. |
| 5,324,675 A | 6/1994 | Hayabuchi |
| 5,334,555 A | 8/1994 | Sugiyama et al. |
| 5,335,198 A | 8/1994 | Van Buskirk et al. |
| 5,338,954 A | 8/1994 | Shimoji |
| 5,345,425 A | 9/1994 | Shikatani |
| 5,349,221 A | 9/1994 | Shimoji |
| 5,350,710 A | 9/1994 | Hong et al. |
| 5,352,620 A | 10/1994 | Komori et al. |
| 5,357,134 A | 10/1994 | Shimoji |
| 5,359,554 A | 10/1994 | Odake et al. |
| 5,361,343 A | 11/1994 | Kosonocky et al. |
| 5,366,915 A | 11/1994 | Kodama |
| 5,375,094 A | 12/1994 | Naruke |
| 5,381,374 A | 1/1995 | Shiraishi et al. |
| 5,393,701 A | 2/1995 | Ko et al. |
| 5,394,355 A | 2/1995 | Uramoto et al. |
| 5,399,891 A | 3/1995 | Yiu et al. |
| 5,400,286 A | 3/1995 | Chu et al. |
| 5,402,374 A | 3/1995 | Tsuruta et al. |
| 5,412,601 A | 5/1995 | Sawada et al. |
| 5,414,693 A | 5/1995 | Ma et al. |
| 5,418,176 A | 5/1995 | Yang et al. |
| 5,418,743 A | 5/1995 | Tomioka et al. |
| 5,422,844 A | 6/1995 | Wolstenholme et al. |
| 5,424,567 A | 6/1995 | Chen |
| 5,424,978 A | 6/1995 | Wada et al. |
| 5,426,605 A | 6/1995 | Van Berkel et al. |
| 5,434,825 A | 7/1995 | Harari |
| 5,436,478 A | 7/1995 | Bergemont et al. |
| 5,436,481 A | 7/1995 | Egawa et al. |
| 5,440,505 A | 8/1995 | Fazio et al. |
| 5,450,341 A | 9/1995 | Sawada et al. |
| 5,450,354 A | 9/1995 | Sawada et al. |
| 5,455,793 A | 10/1995 | Amin et al. |
| 5,467,308 A | 11/1995 | Chang et al. |
| 5,477,499 A | 12/1995 | Van Buskirk et al. |
| 5,495,440 A | 2/1996 | Asakura |
| 5,496,753 A | 3/1996 | Sakurai et al. |
| 5,508,968 A | 4/1996 | Collins et al. |
| 5,518,942 A | 5/1996 | Shrivastava |
| 5,521,870 A | 5/1996 | Ishikawa |
| 5,523,251 A | 6/1996 | Hong |
| 5,523,972 A | 6/1996 | Rashid et al. |
| 5,530,803 A | 6/1996 | Chang et al. |
| 5,534,804 A | 7/1996 | Woo |
| 5,537,358 A | 7/1996 | Fong |
| 5,544,116 A | 8/1996 | Chao et al. |
| 5,553,018 A | 9/1996 | Wang et al. |
| 5,553,030 A | 9/1996 | Tedrow et al. |
| 5,557,221 A | 9/1996 | Taguchi et al. |
| 5,557,570 A | 9/1996 | Iwahashi |
| 5,559,687 A | 9/1996 | Nicollini et al. |
| 5,563,823 A | 10/1996 | Yiu et al. |
| 5,568,085 A | 10/1996 | Eitan et al. |
| 5,579,199 A | 11/1996 | Kawamura et al. |
| 5,581,252 A | 12/1996 | Thomas |
| 5,583,808 A | 12/1996 | Brahmbhatt |
| 5,590,068 A | 12/1996 | Bergemont |
| 5,590,074 A | 12/1996 | Akaogi et al. |
| 5,592,417 A | 1/1997 | Mirabel |
| 5,596,527 A | 1/1997 | Tomioka et al. |
| 5,599,727 A | 2/1997 | Hakozaki et al. |
| 5,600,586 A | 2/1997 | Lee et al. |
| 5,606,523 A | 2/1997 | Mirabel |
| 5,608,679 A | 3/1997 | Mi et al. |
| 5,612,642 A | 3/1997 | McClinyock |
| 5,617,357 A | 4/1997 | Haddad et al. |
| 5,623,438 A | 4/1997 | Guritz et al. |
| 5,627,790 A | 5/1997 | Golla et al. |
| 5,633,603 A | 5/1997 | Lee |
| 5,636,288 A | 6/1997 | Bonneville et al. |
| 5,644,531 A | 7/1997 | Kuo et al. |
| 5,654,568 A | 8/1997 | Nakao |
| 5,656,513 A | 8/1997 | Wang et al. |
| 5,657,332 A | 8/1997 | Auclair et al. |
| 5,661,060 A | 8/1997 | Gill et al. |
| 5,663,907 A | 9/1997 | Frayer et al. |
| 5,672,959 A | 9/1997 | Der |
| 5,675,280 A | 10/1997 | Nomura |
| 5,677,869 A | 10/1997 | Fazio et al. |
| 5,683,925 A | 11/1997 | Irani et al. |
| 5,689,459 A | 11/1997 | Chang et al. |

| | | | | | |
|---|---|---|---|---|---|
| 5,694,356 A | 12/1997 | Wong et al. | 5,973,373 A | 10/1999 | Krautschneider et al. |
| 5,696,929 A | 12/1997 | Hasbun et al. | 5,982,666 A | 11/1999 | Campardo |
| 5,708,608 A | 1/1998 | Park et al. | 5,986,940 A | 11/1999 | Atsumi et al. |
| 5,712,814 A | 1/1998 | Fratin et al. | 5,990,526 A | 11/1999 | Bez et al. |
| 5,712,815 A | 1/1998 | Bill et al. | 5,991,202 A | 11/1999 | Derhacobian et al. |
| 5,715,193 A | 2/1998 | Norman | 5,999,444 A | 12/1999 | Fujiwara et al. |
| 5,717,581 A | 2/1998 | Canclini | 5,999,494 A | 12/1999 | Holzrichter |
| 5,717,632 A | 2/1998 | Richart et al. | 6,000,006 A | 12/1999 | Bruce et al. |
| 5,717,635 A | 2/1998 | Akatsu | 6,005,423 A | 12/1999 | Schultz |
| 5,726,946 A | 3/1998 | Yamagata et al. | 6,011,725 A | 1/2000 | Eitan |
| 5,748,534 A | 5/1998 | Dunlap et al. | 6,018,186 A | 1/2000 | Hsu |
| 5,751,037 A | 5/1998 | Aozasa et al. | 6,020,241 A | 2/2000 | You et al. |
| 5,751,637 A | 5/1998 | Chen et al. | 6,028,324 A | 2/2000 | Su et al. |
| 5,754,475 A | 5/1998 | Bill et al. | 6,030,871 A | 2/2000 | Eitan |
| 5,760,445 A | 6/1998 | Diaz | 6,034,403 A | 3/2000 | Wu |
| 5,760,634 A | 6/1998 | Fu | 6,034,896 A | 3/2000 | Ranaweera et al. |
| 5,768,192 A | 6/1998 | Eitan | 6,037,627 A | 3/2000 | Kitamura et al. |
| 5,768,193 A | 6/1998 | Lee et al. | 6,040,610 A | 3/2000 | Noguchi et al. |
| 5,771,197 A | 6/1998 | Kim | 6,044,019 A | 3/2000 | Cernea et al. |
| 5,774,395 A | 6/1998 | Richart et al. | 6,044,022 A | 3/2000 | Nachumovsky |
| 5,777,919 A | 7/1998 | Chi-Yung et al. | 6,063,666 A | 5/2000 | Chang et al. |
| 5,781,476 A | 7/1998 | Seki et al. | 6,064,226 A | 5/2000 | Earl |
| 5,781,478 A | 7/1998 | Takeuchi et al. | 6,064,251 A | 5/2000 | Park |
| 5,784,314 A | 7/1998 | Sali et al. | 6,064,591 A | 5/2000 | Takeuchi et al. |
| 5,787,036 A | 7/1998 | Okazawa | 6,074,916 A | 6/2000 | Cappelletti |
| 5,793,079 A | 8/1998 | Georgescu et al. | 6,075,402 A | 6/2000 | Ghilardelli |
| 5,801,076 A | 9/1998 | Ghneim et al. | 6,075,724 A | 6/2000 | Li et al. |
| 5,805,500 A | 9/1998 | Campardo et al. | 6,078,518 A | 6/2000 | Chevallier |
| 5,808,506 A | 9/1998 | Tran | 6,081,456 A | 6/2000 | Dadashev |
| 5,812,449 A | 9/1998 | Song | 6,084,794 A | 7/2000 | Lu et al. |
| 5,812,456 A | 9/1998 | Hull et al. | 6,091,640 A | 7/2000 | Kawahara et al. |
| 5,812,457 A | 9/1998 | Arase | 6,094,095 A | 7/2000 | Murray et al. |
| 5,815,435 A | 9/1998 | Van Tran | 6,097,639 A | 8/2000 | Choi et al. |
| 5,822,256 A | 10/1998 | Bauer et al. | 6,107,862 A | 8/2000 | Mukainakano et al. |
| 5,825,683 A | 10/1998 | Chang et al. | 6,108,240 A | 8/2000 | Lavi et al. |
| 5,825,686 A | 10/1998 | Schmitt-Landsiedel et al. | 6,108,241 A | 8/2000 | Chevallier |
| 5,828,601 A | 10/1998 | Hollmer et al. | 6,117,714 A | 9/2000 | Beatty |
| 5,834,851 A | 11/1998 | Ikeda et al. | 6,118,207 A | 9/2000 | Ormerod et al. |
| 5,835,935 A | 11/1998 | Estakhri et al. | 6,118,692 A | 9/2000 | Banks |
| 5,836,772 A | 11/1998 | Chang et al. | 6,122,198 A | 9/2000 | Haddad et al. |
| 5,841,700 A | 11/1998 | Chang | 6,128,226 A | 10/2000 | Eitan et al. |
| 5,847,441 A | 12/1998 | Cutter et al. | 6,128,227 A | 10/2000 | Kim |
| 5,861,771 A | 1/1999 | Matsuda et al. | 6,130,572 A | 10/2000 | Ghilardelli et al. |
| 5,862,076 A | 1/1999 | Eitan | 6,130,574 A | 10/2000 | Bloch et al. |
| 5,864,164 A | 1/1999 | Wen | 6,133,095 A | 10/2000 | Eitan et al. |
| 5,867,429 A | 2/1999 | Chen et al. | 6,134,156 A | 10/2000 | Eitan |
| 5,870,334 A | 2/1999 | Hemink et al. | 6,137,718 A | 10/2000 | Reisinger |
| 5,870,335 A | 2/1999 | Khan et al. | 6,147,904 A | 11/2000 | Liron |
| 5,875,128 A | 2/1999 | Ishizuka et al. | 6,150,800 A | 11/2000 | Kinoshita et al. |
| 5,877,537 A | 3/1999 | Aoki | 6,154,081 A | 11/2000 | Pakkala et al. |
| 5,880,620 A | 3/1999 | Gitlin et al. | 6,156,149 A | 12/2000 | Cheung et al. |
| 5,886,927 A | 3/1999 | Takeuchi | 6,157,242 A | 12/2000 | Fukui |
| RE36,179 E | 4/1999 | Shimoda | 6,157,570 A | 12/2000 | Nachumovsky |
| 5,892,710 A | 4/1999 | Fazio et al. | 6,163,048 A | 12/2000 | Hirose et al. |
| 5,903,031 A | 5/1999 | Yamada et al. | 6,163,484 A | 12/2000 | Uekubo |
| 5,910,924 A | 6/1999 | Tanaka et al. | 6,169,691 B1 | 1/2001 | Pasotti et al. |
| 5,920,503 A | 7/1999 | Lee et al. | 6,175,523 B1 | 1/2001 | Yang et al. |
| 5,920,507 A | 7/1999 | Takeuchi et al. | 6,181,597 B1 | 1/2001 | Nachumovsky |
| 5,926,409 A | 7/1999 | Engh et al. | 6,181,605 B1 | 1/2001 | Hollmer et al. |
| 5,930,195 A | 7/1999 | Komatsu et al. | 6,185,143 B1 | 2/2001 | Perner et al. |
| 5,933,366 A | 8/1999 | Yoshikawa | 6,188,211 B1 | 2/2001 | Rincon-Mora et al. |
| 5,933,367 A | 8/1999 | Matsuo et al. | 6,192,445 B1 | 2/2001 | Rezvani |
| 5,936,888 A | 8/1999 | Sugawara | 6,195,196 B1 | 2/2001 | Kimura et al. |
| 5,940,332 A | 8/1999 | Artieri | 6,198,342 B1 | 3/2001 | Kawai |
| 5,946,258 A | 8/1999 | Evertt et al. | 6,201,282 B1 | 3/2001 | Eitan |
| 5,946,558 A | 8/1999 | Hsu | 6,201,737 B1 | 3/2001 | Hollmer et al. |
| 5,949,714 A | 9/1999 | Hemink et al. | 6,205,056 B1 | 3/2001 | Pan et al. |
| 5,949,728 A | 9/1999 | Liu et al. | 6,205,059 B1 | 3/2001 | Gutala et al. |
| 5,963,412 A | 10/1999 | En | 6,208,200 B1 | 3/2001 | Arakawa |
| 5,963,465 A | 10/1999 | Eitan | 6,208,557 B1 | 3/2001 | Bergemont et al. |
| 5,966,603 A | 10/1999 | Eitan | 6,214,666 B1 | 4/2001 | Mehta |
| 5,969,989 A | 10/1999 | Iwahashi | 6,215,148 B1 | 4/2001 | Eitan |
| 5,969,993 A | 10/1999 | Takeshima | 6,215,697 B1 | 4/2001 | Lu et al. |

| | | |
|---|---|---|
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 | 9/2001 | Cohen et al. |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,337,502 B1 | 1/2002 | Eitan et al. |
| 6,339,556 B1 | 1/2002 | Watanabe |
| 6,343,033 B1 | 1/2002 | Parker |
| 6,344,959 B1 * | 2/2002 | Milazzo ................. 361/92 |
| 6,346,442 B1 | 2/2002 | Aloni et al. |
| 6,348,381 B1 | 2/2002 | Jong |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,062 B1 * | 3/2002 | Elmhurst et al. ........... 323/282 |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnickle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,440,797 B1 | 8/2002 | Wu et al. |
| 6,442,074 B1 | 8/2002 | Hamilton et al. |
| 6,445,030 B1 | 9/2002 | Wu et al. |
| 6,449,190 B1 | 9/2002 | Bill |
| 6,452,438 B1 | 9/2002 | Li |
| 6,456,528 B1 | 9/2002 | Chen |
| 6,456,533 B1 | 9/2002 | Hamilton et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,085 B1 | 11/2002 | Kuo |
| 6,490,204 B2 | 12/2002 | Bloom et al. |
| 6,496,414 B2 | 12/2002 | Kasa et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Rangarajan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,570,211 B1 | 5/2003 | Guterman et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,608,905 B1 * | 8/2003 | Muza et al. ................. 381/111 |
| 6,614,295 B2 | 9/2003 | Tsuchi |
| 6,614,686 B1 | 9/2003 | Kawamura |
| 6,614,692 B2 | 9/2003 | Eliyahu et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 | 11/2003 | Sofer et al. |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |

| | | | | | |
|---|---|---|---|---|---|
| 6,653,191 | B1 | 11/2003 | Yang et al. | | |
| 6,654,296 | B2 | 11/2003 | Jang et al. | | |
| 6,664,588 | B2 | 12/2003 | Eitan | | |
| 6,665,769 | B2 | 12/2003 | Cohen et al. | | |
| 6,670,241 | B1 | 12/2003 | Kamal et al. | | |
| 6,670,669 | B1 | 12/2003 | Kawamura | | |
| 6,674,138 | B1 | 1/2004 | Halliyal et al. | | |
| 6,677,805 | B2 | 1/2004 | Shor et al. | | |
| 6,680,509 | B1 | 1/2004 | Wu et al. | | |
| 6,686,242 | B2 | 2/2004 | Willer et al. | | |
| 6,690,602 | B1 | 2/2004 | Le et al. | | |
| 6,693,483 | B2 * | 2/2004 | Deml et al. | | 327/536 |
| 6,700,818 | B2 | 3/2004 | Shappir et al. | | |
| 6,717,207 | B2 | 4/2004 | Kato | | |
| 6,723,518 | B2 | 4/2004 | Papsidero et al. | | |
| 6,731,542 | B1 | 5/2004 | Le et al. | | |
| 6,738,289 | B2 | 5/2004 | Gongwer et al. | | |
| 6,744,692 | B2 | 6/2004 | Shiota et al. | | |
| 6,765,259 | B2 | 7/2004 | Kim | | |
| 6,768,165 | B1 | 7/2004 | Eitan | | |
| 6,788,579 | B2 | 9/2004 | Gregori et al. | | |
| 6,791,396 | B2 | 9/2004 | Shor et al. | | |
| 6,794,249 | B2 | 9/2004 | Palm et al. | | |
| 6,831,872 | B2 | 12/2004 | Matsuoka | | |
| 6,836,431 | B2 | 12/2004 | Chang | | |
| 6,859,028 | B2 * | 2/2005 | Toner | | 324/76.53 |
| 6,871,258 | B2 | 3/2005 | Micheloni et al. | | |
| 6,885,585 | B2 | 4/2005 | Maayan et al. | | |
| 6,912,160 | B2 | 6/2005 | Yamada | | |
| 6,917,544 | B2 | 7/2005 | Maayan et al. | | |
| 6,928,001 | B2 | 8/2005 | Avni et al. | | |
| 6,937,523 | B2 | 8/2005 | Eshel | | |
| 6,967,872 | B2 | 11/2005 | Quader et al. | | |
| 6,996,692 | B2 | 2/2006 | Kouno | | |
| 7,079,420 | B2 | 7/2006 | Shappir et al. | | |
| 2001/0006477 | A1 | 7/2001 | Banks | | |
| 2002/0004878 | A1 | 1/2002 | Norman | | |
| 2002/0004921 | A1 | 1/2002 | Muranaka et al. | | |
| 2002/0064911 | A1 | 5/2002 | Eitan | | |
| 2002/0132436 | A1 | 9/2002 | Eliyahu et al. | | |
| 2002/0140109 | A1 | 10/2002 | Keshavarzi et al. | | |
| 2002/0145465 | A1 | 10/2002 | Shor et al. | | |
| 2002/0191465 | A1 | 12/2002 | Maayan et al. | | |
| 2002/0199065 | A1 | 12/2002 | Subramoney et al. | | |
| 2003/0001213 | A1 | 1/2003 | Lai | | |
| 2003/0021155 | A1 | 1/2003 | Yachareni et al. | | |
| 2003/0072192 | A1 | 4/2003 | Bloom et al. | | |
| 2003/0076710 | A1 | 4/2003 | Sofer et al. | | |
| 2003/0117841 | A1 | 6/2003 | Yamashita | | |
| 2003/0131186 | A1 | 7/2003 | Buhr | | |
| 2003/0134476 | A1 | 7/2003 | Roisin et al. | | |
| 2003/0142544 | A1 | 7/2003 | Maayan et al. | | |
| 2003/0145176 | A1 | 7/2003 | Dvir et al. | | |
| 2003/0145188 | A1 | 7/2003 | Cohen et al. | | |
| 2003/0155659 | A1 | 8/2003 | Verma et al. | | |
| 2003/0190786 | A1 | 10/2003 | Ramsbey et al. | | |
| 2003/0197221 | A1 | 10/2003 | Shinozaki et al. | | |
| 2003/0202411 | A1 | 10/2003 | Yamada | | |
| 2003/0206435 | A1 | 11/2003 | Takahashi | | |
| 2003/0208663 | A1 | 11/2003 | Van Buskirk et al. | | |
| 2003/0209767 | A1 | 11/2003 | Takahashi et al. | | |
| 2003/0214844 | A1 | 11/2003 | Iijima | | |
| 2003/0218207 | A1 | 11/2003 | Hashimoto et al. | | |
| 2003/0218913 | A1 | 11/2003 | Le et al. | | |
| 2003/0222303 | A1 | 12/2003 | Fukuda et al. | | |
| 2003/0227796 | A1 | 12/2003 | Miki et al. | | |
| 2004/0012993 | A1 | 1/2004 | Kurihara | | |
| 2004/0013000 | A1 | 1/2004 | Torii | | |
| 2004/0014290 | A1 | 1/2004 | Yang et al. | | |
| 2004/0021172 | A1 | 2/2004 | Zheng et al. | | |
| 2004/0027858 | A1 | 2/2004 | Takahashi et al. | | |
| 2004/0151034 | A1 | 8/2004 | Shor et al. | | |
| 2004/0153621 | A1 | 8/2004 | Polansky et al. | | |
| 2004/0157393 | A1 | 8/2004 | Hwang | | |
| 2004/0222437 | A1 | 11/2004 | Avni et al. | | |
| 2005/0117395 | A1 | 6/2005 | Maayan et al. | | |
| 2005/0140405 | A1 | 6/2005 | Do et al. | | |

FOREIGN PATENT DOCUMENTS

| | | |
|---|---|---|
| EP | 0751560 | 6/1995 |
| EP | 0693781 | 1/1996 |
| EP | 0 822 557 | 2/1998 |
| EP | 0 843 398 | 5/1998 |
| EP | 0580467 | 9/1998 |
| EP | 0461764 | 7/2000 |
| EP | 1 071 096 | 1/2001 |
| EP | 1073120 | 1/2001 |
| EP | 1 091 418 | 4/2001 |
| EP | 1128488 | 8/2001 |
| EP | 0740307 | 12/2001 |
| EP | 1154597 | 12/2001 |
| EP | 1 207 552 | 5/2002 |
| EP | 1 223 586 | 7/2002 |
| EP | 1 365 452 | 11/2003 |
| EP | 001217744 | 3/2004 |
| GB | 1297899 | 11/1972 |
| GB | 2157489 | 3/1985 |
| JP | 54-053929 | 4/1979 |
| JP | 60-200566 | 10/1985 |
| JP | 60201584 | 10/1985 |
| JP | 60201594 | 10/1985 |
| JP | 63-249375 | 10/1988 |
| JP | 3-285358 | 12/1991 |
| JP | 04-226071 | 8/1992 |
| JP | 04-291962 | 10/1992 |
| JP | 05021758 | 1/1993 |
| JP | 06151833 | 5/1994 |
| JP | 06-232416 | 8/1994 |
| JP | 07193151 | 7/1995 |
| JP | 08-108791 | 4/1996 |
| JP | 09-017981 | 1/1997 |
| JP | 09162314 | 6/1997 |
| JP | 10-106276 | 4/1998 |
| JP | 08-297888 | 11/1998 |
| JP | 10 334676 | 12/1998 |
| JP | 11-162182 | 6/1999 |
| JP | 11-354758 | 12/1999 |
| JP | 2001-085646 | 3/2001 |
| JP | 2001-156189 | 6/2001 |
| JP | 2002-216488 | 8/2002 |
| JP | 3358663 | 10/2002 |
| WO | WO 81/00790 | 3/1981 |
| WO | WO 98/15553 | 5/1996 |
| WO | WO 96/25741 | 8/1996 |
| WO | WO 98/03977 | 1/1998 |
| WO | WO 99/31670 | 6/1999 |
| WO | WO 99/57728 | 11/1999 |
| WO | WO 00/46808 | 8/2000 |
| WO | WO 01/65566 | 9/2001 |
| WO | WO 01/65567 | 9/2001 |
| WO | WO 01/84552 | 11/2001 |
| WO | WO 02/43073 | 5/2002 |
| WO | WO 03/032393 | 4/2003 |
| WO | WO 03/036651 | 5/2003 |
| WO | WO 03/054964 | 7/2003 |
| WO | WO 03/063167 | 7/2003 |
| WO | WO 03/063168 | 7/2003 |
| WO | WO 03/079370 | 9/2003 |
| WO | WO 03/079446 | 9/2003 |
| WO | WO 03/083916 | 10/2003 |
| WO | WO 03/088258 | 10/2003 |
| WO | WO 03/088259 | 10/2003 |
| WO | WO 03/088260 | 10/2003 |
| WO | WO 03/088261 | 10/2003 |
| WO | WO 03/088353 | 10/2003 |

WO    WO 03/100790    12/2003

OTHER PUBLICATIONS

Bude et al., EEPROM/Flash Sub 3.0V drain—Source Bias Hot Carrier Writing, IEDM, 1995, pp. 989-992.
Bude et al., Secondary Electron Flash—a High Performance, Low Power Flash Technology for 0.35 um and below, IEDM, 1997, 279-282.
Bude et al., Modeling Nonequilibrium Hot Carrier Device Effects, Conference of Insulator Specialists of Europe, Jun. 1997, Sweden.
Jung et al., IEEE Journal of Solid-State Circuits, Nov. 1996, 1575-1583, vol. 31, No. 11.
Campardo et al., IEEE Journal of Solid-State Circuits, Nov. 2000, 1655-1667, vol. 35, No. 11.
Lin et al., Novel Source-Controlled Self-Verified Programming for Multilevel EEPROM's, IEEE Transactions on Electron Devices, Jun. 2000, 1166-1174, vol. 47, No. 6.
Chan et al., A True Single-Transistor Oxide-Nitride-Oxide EEPROM Device, IEEE Electron Device Letters, Mar. 1987, vol. EDL-8, No. 3.
Eitan et al., "Hot-Electron Injection into the Oxide in n-Channel MOS Devices", IEEE Transactions on Electron Devices, vol. ED-28, No. 3, pp. 328-370, Mar. 1981.
Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.
Ma et al., A Dual-bit Split-Gate EEPROM (DSG) Cell in Contactless Array for SIngle-Vcc High Density Flash Memories, IEEE, 1994, 57-60.
Oshima et al., Process and Device Technologies for 16Mbit EPROMs with Large-Tilt-Angle Implanted P-Pocket Cell, IEEE, Dec. 1990, Ch. 2865-4/90/0000-0095, pp. 521-524, San Francisco, California.
Lee, A new approach for the floating-gate MOS nonvolatile memory, Applied Physics Letters, Oct. 1977, 475-476, vol. 31, No. 7, American Institute of Physics.
Glasser et al., MOS Device Electronics, The Design and Analysis of VLSI Circuits, Chapter 2, 67-163, 1998, Addison-Wesley Publishing Company.
Bhattacharyya et al., FET Gate Structure for Nonvolatile N-Channel Read-Mostly Memory Device, IBM Technical Disclosure Bulletin, Nov. 1975, 1768, vol. 18, No. 6.
Ricco et al., Nonvolatile Multilevel Memories for Digital Applications, Dec. 1998, 2399-2421, vol. 86, No. 12 Institute of Electrical and Electronics Engineers, Inc.
Martin, Improved Circuits for the Realization of Switched-Capacitor Filters, IEEE Transactions on Circuits and Systems, Apr. 1980, 237-244, vol. CAS-27.
Tseng et al., "Thin CVD Stacked Gate Dielectric for ULSI Technology", IEEE, pp. 321-214; 1993, 13.1.1-13.1.4.
Pickar, Ion Implementation is Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.
Umezawa et al., A 5-V-Only Operation 0.6-μm Flash EEPROM with Row Decoder Scheme in Triple-Well Structure, IEEE Journal of Solid-State Circuits, 1992, 1540, vol. 27.
Mitchell et al., A new self-aligned planar array cell for ultra high density EPROMS, 1987.
Esquivel et al., High Density Contactless, Self Aligned EPROM Cell Array Technology, 1986.
Johns, Martin, Analog Integrated Circuit Design, Jun. 1, 1997, Chapter 10, John Wiley and Sons Inc.
Allen et al., CMOS Analog Circuit Design, 2002, 259 pages, Oxford University Press.
Klinke et al., A very-high-slew-rate CMOS operational amplifier, IEEE Journal of Solid-State Circuits, 1989, 744-746, 24 Vol.
Shor et al, paper WA2.04.01—Self regulated Four phased charged pump with boosted wells, ISCAS 2002.
Fotouhi, An efficient CMOS line driver for 1.544-Mb/s T1 and 2.048-Mb/s E1 applications, IEEE Journal of Solid-State Circuits, 2003, 226-236pages, 38vol.
P-N Junction Diode, Physics of semiconductor devices, 1981, Ch. 2, "A Wiley-Interscience Publication", John Wiley & Sons Publishers.
Chang, Non Volatile Semiconductor Memory Devices, Proceedings of the IEEE, 64 vol., No. 7, pp. 1039-1059; Jul. 1976.
Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.
4 Bits of Digital Data Fit in a Single Cell, Technology Newsletter, Electronic Design, Apr. 1, 1996.
M. Specht et al, Novel Dual Bit Tri- Gate Charge Trapping Memory Devices, IEEE Electron Device Letters, vol. 25, No. 12, Dec. 2004, pp. 810-812.
Bu, Jiankang et al., "Design Considerations in Scaled SONOS Nonvolatile Memory Devices" Lehigh University, Bethlehem, PA, Power Point Presentation, pp. 1-24, 2000; http://klabs.org/richcontent/MemoryContent/nvmt_symp/nvmts_2000/presentations/bu_white_sonos_lehigh_univ.pdf.
Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.
"Philips Research—Technologies—Embedded Nonvolatile Memories" http://research.philips.com/technologies/ics/nvmemories/index.html.
"Semiconductor Memory: Non-Volatile Memory (NVM)", National University of Singapore, Department of Electrical and Computer Engineering: http://ece.nus.edu.sg/stfpage/elezhucx/myweb/NVM.pdf.

* cited by examiner

METHOD AND APPARATUS FOR MEASURING CHARGE PUMP OUTPUT CURRENT

FIELD OF THE INVENTION

The present invention relates generally to charge pumps for boosting voltages in microelectronic circuitry, and particularly to a method for measuring the output current of the charge pump.

BACKGROUND OF THE INVENTION

Non-volatile memory arrays, such as erasable, programmable read only memory (EPROM) or flash memory arrays, or electrically erasable, programmable read only memory (EEPROM) arrays, require high positive or negative voltages to program and erase memory cells of the array. Typically, these voltages are higher than the voltage supplied (Vdd). Charge pumps are generally used to boost on-chip voltages above the supply voltage Vdd to reach the voltages required for programming or erasing.

A charge pump typically comprises cascaded stages that progressively boost the voltage to higher levels. The charge pump functions by progressively storing more charge on a reference capacitor which is part of a capacitor-diode combination, with several such stages being placed together in a network to obtain the desired increase in voltage. The diode functions to prevent discharge of the capacitor prior to placing the additional charge thereon.

Many applications require measuring the output current of the charge pump, for example, for measuring the program or erase current for flash cell applications. In the prior art, measuring the output current of the charge pump is typically accomplished by sensing or measuring internal signals of the charge pump. For example, for an on/off charge pump, the internal signal "oscillator_on" include reference information about the charge pump load—the ratio of the actual output current to the maximum output current (Iout/Iout_max). For a supply charge pump, the internal signal "supply clamp" may provide that reference information.

However, using these internal signals has disadvantages. The charge pump maximal output current Iout_max is a function of several parameters, such as but not limited to, Vdd, temperature and corner technology process. Since the ratio of the actual output current to the maximum output current is dependent upon these parameters, it is not possible to measure the absolute value of the output current (Iout).

Other methods have been used in the art to measure the output current, but they have disadvantages, such as requiring significant circuit board area and/or having relatively high power dissipation.

SUMMARY OF THE INVENTION

The present invention provides a novel method for measuring the output current of a charge pump or charge pump stage, as is described more in detail hereinbelow. In the present invention, an additional output stage may be connected to the existing charge pump output stage. The additional output stage may use the same phase signals as the existing charge pump output stage. The additional output stage can be scaled down to minimize size. The included stage output current may be measured by comparing with a reference current. If the output voltages of the additional and existing output stages are equal, then the ratio of their currents is equal to their size ratio.

In accordance with a non-limiting embodiment of the invention, instead of adding an entire additional output stage, an additional output pass device (transistor or diode) of stage #n can be added, which connects the previous stage output ($Vo_{n-1}$) to the charge pump output (Vout). The transistor/diode may be scaled down to a minimal size to reduce power dissipation and/or board size.

The simple circuitry implementation of the present invention may significantly reduce the chip/board area needed for the circuitry, as well as significantly reducing power dissipation. The invention is fast, accurate and insensitive to charge pump architecture and regulation.

There is thus provided in accordance with an embodiment of the present invention a method for measuring output current of a charge pump, the method including providing a charge pump including a plurality of n charge pump stages, wherein an output of stage n−1 ($Vo_{n-1}$) is output to stage n, an output voltage of stage n being referred to as charge pump voltage output Vout, connecting an additional output pass device to the output of stage n−1, an output voltage of the additional output pass device being referred to as Voutm, forcing Voutm to be at least approximately equal to Vout, drawing at least one of output voltage (Voutm) and output current (Ioutm) from the additional output pass device, measuring Ioutm (e.g., comparing Ioutm with a reference current), and correlating Iout with Ioutm.

In accordance with an embodiment of the present invention if output voltages of the additional output pass device and the charge pump stage n are equal, then a current ratio (Ioutm/Iout) is equal to a ratio of sizes of the additional output pass device and the charge pump stage n.

Further in accordance with an embodiment of the present invention the additional output pass device may include an additional output stage. The additional output stage may use identical phase signals as stage n. The additional output pass device may be scaled down to minimize its size.

In accordance with an embodiment of the present invention the additional output pass device may include a p-n diode; a n-p diode; an NMOS transistor, whose source is connected to the output of stage n−1 and whose drain is connected to an input of stage n, and whose gate and source are connected to one another; a PMOS transistor, whose drain is connected to the output of stage n−1 and whose source is connected to an input of stage n, and whose gate and drain are connected to one another; an NMOS transistor, whose source is connected to the output of stage n−1 and whose drain is connected to an input of stage n, and whose gate is connected to a control voltage; or alternatively, a PMOS transistor, whose drain is connected to the output of stage n−1 and whose source is connected to an input of stage n, and whose gate is connected to a control voltage.

Further in accordance with an embodiment of the present invention comparing Ioutm with the reference current may include inputting the charge pump output Vout and the additional output device output Voutm into a current mirror, and measuring and comparing currents flowing through sides of the current mirror.

There is also provided in accordance with an embodiment of the present invention circuit architecture for measuring output current of a charge pump, including a charge pump including a plurality of n charge pump stages, wherein an output of stage n−1 ($Vo_{n-1}$) is output to stage n, an output voltage of stage n being referred to as charge pump voltage output Vout, an additional output pass device connected to the output of stage n−1, an output voltage of the additional output pass device being referred to as Voutm, a first circuit portion for forcing Voutm to be at least approximately equal to Vout and for drawing at least one of output voltage (Voutm) and output current (Ioutm) from the additional output pass device, and a second circuit portion for measuring current Ioutm and correlating Iout with Ioutm.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 1:
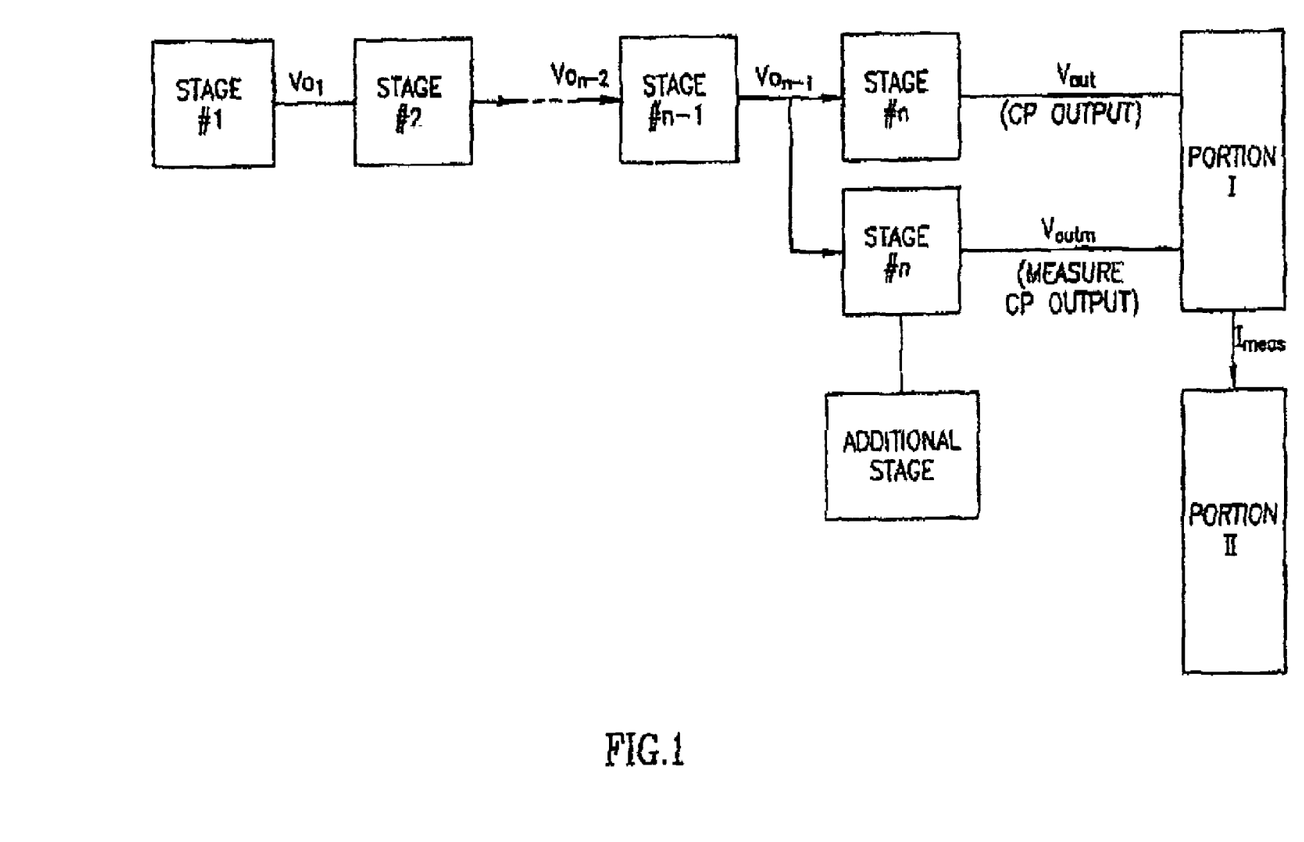
FIG. 1 is a simplified circuit diagram of a charge pump architecture, constructed and operative in accordance with an embodiment of the present invention, with an additional output stage connected to the existing charge pump output stage.

Reference is now made to FIG. 1, which illustrates a charge pump architecture, constricted and operative in accordance with an embodiment of the present invention.

The charge pump architecture includes a plurality of n charge pump stages (stage 1, stage 2, ... stage n–1, stage n). As is well known in the art, the charge pump stages may include charge transfer transistors that may use, but are not limited to, CMOS (complementary metal oxide semiconductor) technology, being either n-channel or p-channel (NMOS or PMOS) field effect transistors (FETs). NMOS is generally used to pump positive voltages, whereas PMOS is generally used to pump negative voltages.

Each stage outputs a voltage to the next successive stage. Accordingly, the output of stage 1 ($Vo_1$) is output to stage 2, the output of stage 2 ($Vo_2$) is output to stage 3, and so forth, wherein the output of stage n–1 ($Vo_{n-1}$) is output to stage n. The voltage output of stage n is the charge pump output Vout.

In accordance with an embodiment of the present invention an additional output stage may be connected to the existing charge pump output stage. Specifically an additional output stage n may be connected to the output of stage n–1. The additional output stage may use the same phase signals as the existing charge pump output stage. The additional output stage can be scaled down to minimize size. The additional output stage output current is referred to as Ioutm.

In simplified terms, which will be described more in detail hereinbelow with reference to FIGS. 3 and 4, a first circuit portion is provided that forces the output voltage of the additional output stage (Voutm) to be equal or approximately equal to the charge pump output voltage (Vout). The first circuit portion also draws output current or voltage from the additional output stage and sends it to a second circuit portion. The second circuit portion measures the output current or voltage from the additional output stage (wherein Voutm may be converted to Ioutm by suitable application of Ohm's law, for example). The current Ioutm may be measured in a number of ways. For example, it may be measured by comparing with a reference current Iref (as is described more in detail hereinbelow). This comparison may be used to produce a binary result. For example, if Iref >Ioutm then the binary result is 0. If Iref ≦Ioutm then the binary result is 1.

Figure 2A:
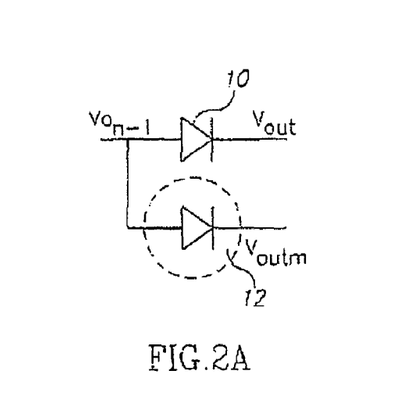
FIGS. 2A–2F are simplified circuit diagrams of different types of output pass devices (e.g., transistors or diodes) that can be used to connect the previous stage output to the charge pump output, in accordance with different embodiments of the present invention.
Figure 2B:
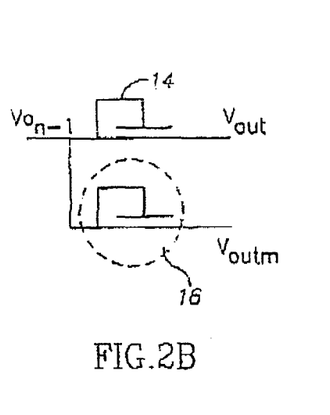
Figure 2C:
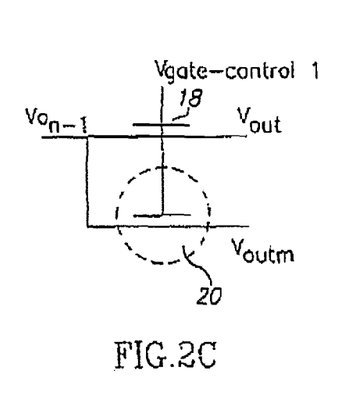

Reference is now made to FIGS. 2A–2C. In accordance with a non-limiting embodiment of the invention, instead of adding an entire additional output stage, an additional output pass device (e.g., transistor or diode) of stage n can be added, which connects the previous stage output ($Vo_{n-1}$) to the charge pump output Vout. In all embodiments, the additional output pass device may be scaled down to a minimal size to reduce power dissipation and/or board size.

For example, in the charge pump stages of FIG. 2A, the previous stage output ($Vo_{n-1}$) is connected to the charge pump output Vout with a p-n diode 10. Accordingly, in the present invention, an identical output pass device 12 (i.e., p-n diode 12) may be connected to the previous stage output ($Vo_{n-1}$). The current output Ioutm of this additional p-n diode 12 may be measured (by comparing with a reference current) to obtain the charge pump output current.

In the charge pump stages of FIG. 2B, the previous stage output ($Vo_{n-1}$) is connected to the charge pump output Vout with an NMOS transistor 14 in diode connection. By "diode connection" it is meant that the source of NMOS transistor 14 is connected to the output of the previous stage output ($Vo_{n-1}$) and its drain is connected to the input of stage n (Vout). The gate of NMOS transistor 14 is connected to its source. Accordingly, in the present invention, an identical output pass device 16 (i.e., NMOS transistor 16) may be connected to the previous stage output ($Vo_{n-1}$) in diode connection. The current output Ioutm of this additional NMOS transistor 16 may be measured (by comparing with a reference current) to obtain the charge pump output current.

In the charge pump stages of FIG. 2C, the previous stage output ($Vo_{n-1}$) is connected to the charge pump output Vout with an NMOS transistor 18 with gate control signal. In this connection, the source of NMOS transistor 18 is connected to the output of the previous stage output ($Vo_{n-1}$) and its drain is connected to the input of stage n (Vout). The gate of NMOS transistor 18 is connected to a control voltage Vgate-control (or briefly, Vgc). Accordingly, in the present invention, an identical output pass device 20 (i.e., NMOS transistor 20) may be connected to the previous stage output ($Vo_{n-1}$). The same gate control voltage Vgc may be connected to the gate of NMOS transistor 20. The current output Ioutm of this additional NMOS transistor 20 may be measured (by comparing with a reference current) to obtain the charge pump output current.

Figure 2D:
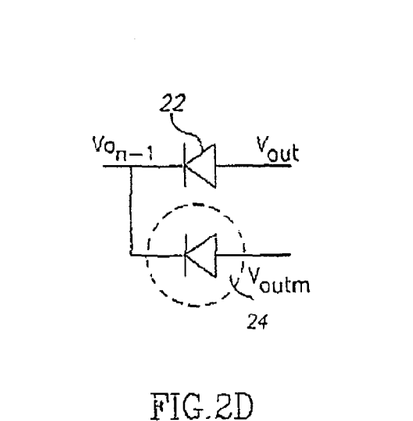
Figure 2E:
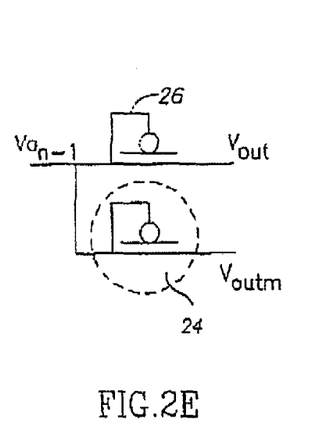
Figure 2F:
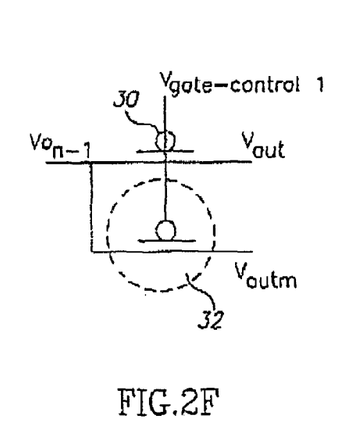

The circuitries shown in FIGS. 2A–2C are non-limiting examples of circuitry which may be used in positive charge pumps. Reference is now made to FIGS. 2D–2F, which are non-limiting examples of circuitry which may be used in negative charge pumps.

In the charge pump stages of FIG. 2D, the previous stage output ($Vo_{n-1}$) is connected to the charge pump output Vout with an n-p diode 22. Accordingly, in the present invention, an identical output pass device 24 (i.e., n-p diode 24) may be connected to the previous stage output ($Vo_{n-1}$). The current output Ioutm of this additional n-p diode 24 may be measured (by comparing with a reference current) to obtain the charge pump output current.

In the charge pump stages of FIG. 2E, the previous stage output ($Vo_{n-1}$) is connected to the charge pump output Vout with a PMOS transistor 26 in diode connection. The drain of PMOS transistor 26 is connected to the output of the previous stage output ($Vo_{n-1}$) and its source is connected to the input of stage n (Vout). The gate of PMOS transistor 26 is connected to its drain. Accordingly, in the present invention, an identical output pass device 28 (i.e., PMOS transistor 28) may be connected to the previous stage output ($Vo_{n-1}$) in diode connection. The current output Ioutm of this additional PMOS transistor 28 may be measured (by comparing with a reference current) to obtain the charge pump output current.

In the charge pump stages of FIG. 2F, the previous stage output ($Vo_{n-1}$) is connected to the charge pump output Vout with a PMOS transistor 30 with gate control signal. In this connection, the drain of PMOS transistor 30 is connected to the output of the previous stage output ($Vo_{n-1}$) and its source is connected to the input of stage n (Vout). The gate of PMOS transistor 30 is connected to a control voltage Vgc. Accordingly, in the present invention, an identical output pass device 32 (i.e., PMOS transistor 32) may be connected to the previous stage output ($Vo_{n-1}$). The same gate control voltage Vgc may be connected to the gate of PMOS transistor 32. The current output Ioutm of this additional PMOS transistor 32 may be measured (by comparing with a reference current) to obtain the charge pump output current.

Figure 3:
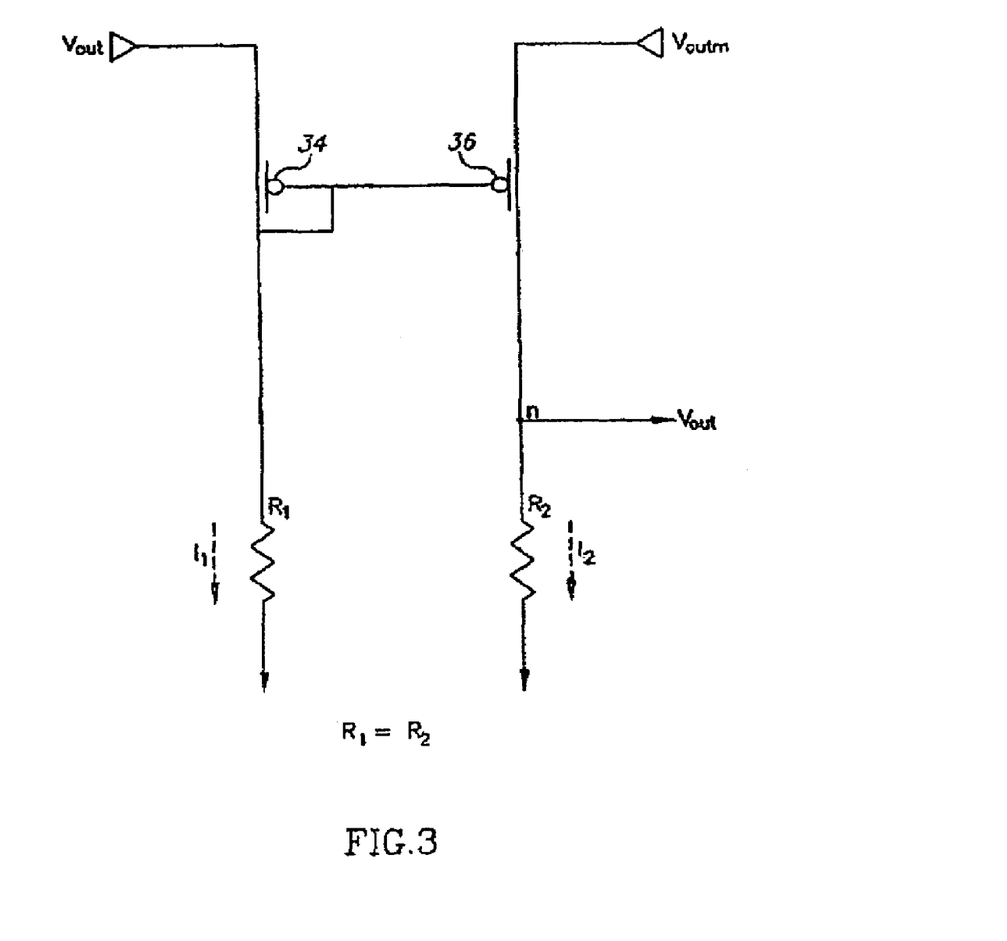
FIGS. 3 and 4 are simplified circuit diagrams of circuitry, wherein output current of the additional output stage is measured by comparing with a reference current, in accordance with different embodiments of the present invention.

Reference is now made to FIG. 3, which illustrates current comparison circuitry for measuring the output current of the additional output stage/output pass device, in accordance with an embodiment of the present invention. The output current Ioutm is measured by comparing with a reference current.

In the non-limiting embodiment of FIG. 3, the charge pump output Vout and the additional output device output Voutm are input into a current mirror. Specifically, in this non-limiting example, the current mirror includes a pair of PMOS transistors 34 and 36, whose gates are connected to one another. Vout is input to the source of PMOS transistor 34. The gate of PMOS transistor 34 is connected to its bulk and drain Voutm is input to the source of PMOS transistor 36. The source of PMOS transistor 34 is connected to a resistor $R_1$. The drain of PMOS transistor 36 is connected to a node n which outputs Vout and which is connected to a resistor $R_2$. The current flowing through resistor $R_1$ is $I_1$ and current flowing through resistor $R_2$ is $I_2$. Current $I_1$ is the current from stage n and current $I_2$ is the current from the additional stage.

The voltage exiting PMOS transistor 34 and entering the gate of PMOS transistor 36 ($V_{g36}$) is equal to Vout−$V_{gs34}$ (i.e., the gate-source voltage of PMOS transistor 34). In addition, Voutm=$V_{g36}$+$V_{gs36}$ (i.e., the sum of the gate voltage and gate-source voltage of PMOS transistor 36). Since $V_{g36}$=Vout−$V_{gs34}$, Voutm=Vout−$V_{gs34}$+$V_{gs36}$.

The current mirror of PMOS transistors 34 and 36 is preferably designed such that $V_{gs34} \approx V_{gs36}$. This results in Voutm≈Vout. Accordingly, the current mirror of PMOS transistors 34 and 36 and the resistor $R_1$ form the first circuit portion, which forces Voutm to be equal or approximately equal to the charge pump output voltage (Vout). The first circuit portion also draws output current or voltage from the additional output stage (e.g., $I_2$) and sends it to a second circuit portion, which comprises node n and resistor $R_2$. In the second circuit portion, $I_2$ can easily be measured. For example, since the charge pump output voltage Vout and the additional output device output voltage Voutm are equal or approximately equal, the ratio of the currents $I_1$ and $I_2$ is equal or approximately equal to their size ratio. For example, in the non-limiting case of $R_1$=$R_2$, $I_1$=$I_2$.

Figure 4:
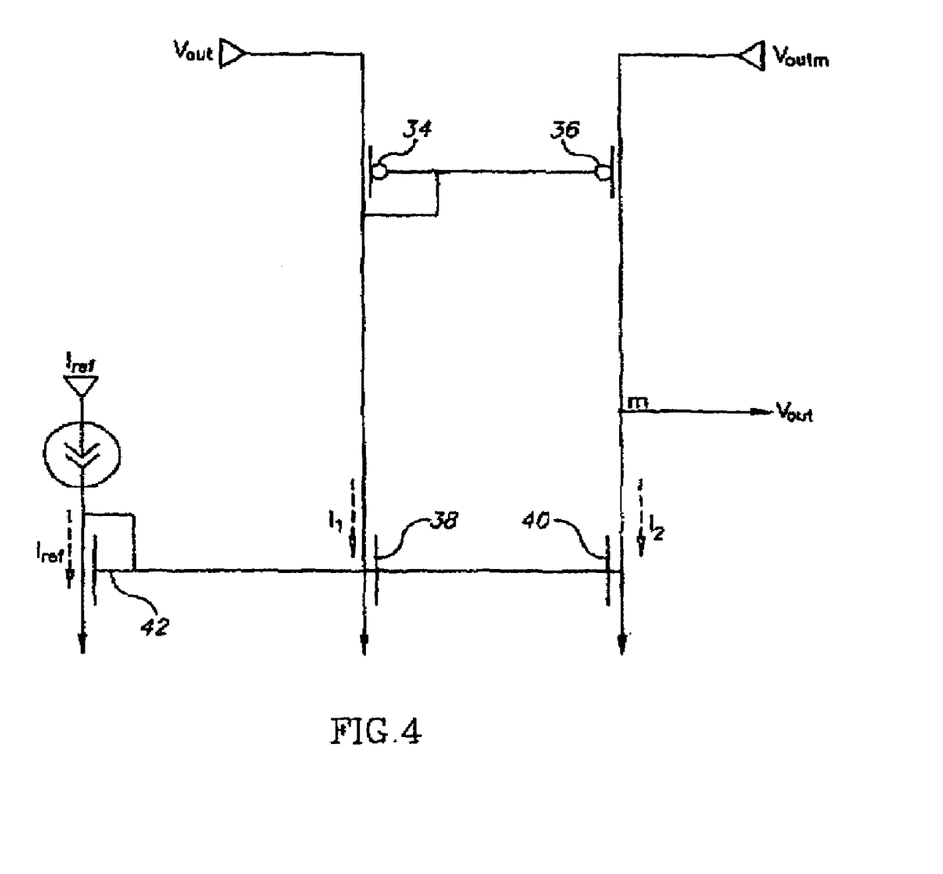

Reference is now made to FIG. 4, which illustrates current comparison circuitry for measuring the output current of the additional output stage/output pass device, in accordance with another embodiment of the present invention.

In the non-limiting embodiment of FIG. 4, the charge pump output Vout and the additional output device output Voutm are input into a current mirror comprising PMOS transistors 34 and 36, as similarly described for the embodiment of FIG. 3. In the embodiment of FIG. 4, instead of resistors $R_1$ and $R_2$, the PMOS current mirror is connected to an NMOS current mirror. Specifically, the drain of PMOS transistor 34 is connected to the drain of an NMOS transistor 38 and the drain of PMOS transistor 36 is connected to the drain of an NMOS transistor 40. The gates of NMOS transistors 38 and 40 are connected to each other. The sources of NMOS transistors 38 and 40 are connected to ground. The gate of NMOS transistor 38 is connected to the gate of another NMOS transistor 42, whose source is grounded. The drain of NMOS transistor 42 is connected to a current source Iref. The gate of NMOS transistor 42 is connected to its drain.

The current from stage n flows through the left side of the current mirrors, and the current from the additional stage flows through the right side of the current mirrors.

As similarly described above for FIG. 3, the current mirror of PMOS transistors 34 and 36 is preferably designed such that $V_{gs34} \approx V_{gs36}$, which means Voutm≈Vout. Accordingly, the current mirror of PMOS transistors 34 and 36 and the NMOS transistor 38 form the first circuit portion, which forces Voutm to be equal or approximately equal to the charge pump output voltage (Vout). The first circuit portion also draws output current or voltage from the additional output stage (e.g., $I_2$) and sends it to a second circuit portion, which comprises node n and NMOS transistor 40. In the second circuit portion, $I_2$ can easily be measured. For example, since the charge pump output voltage Vout and the additional output device output voltage Voutm are equal or approximately equal, the ratio of the currents $I_1$ and $I_2$ is equal or approximately equal to their size ratio. By comparing with Iref, the current from stage n (the charge pump current) may be obtained.

It will be appreciated by person skilled in the art, that the present invention is not limited by what has been particularly shown and described herein above. Rather the scope of the present invention is defined only by the claims which follow:

What is claimed is:

1. A method for measuring output current (Iout) of a charge pump, the method comprising:
   providing a charge pump comprising a plurality of n charge pump stages, wherein an output of stage n−1 ($Vo_{n-1}$) is output to stage n, an output voltage of stage n being referred to as charge pump voltage output Vout;
   connecting an additional output pass device to the output of stage n−1, an output voltage of said additional output pass device being referred to as Voutm;
   forcing Voutm to be at least approximately equal to Vout;
   drawing at least one of output voltage (Voutm) and output current (Ioutm) from the additional output pass device;
   measuring Ioutm; and
   correlating Iout with Ioutm.

2. The method according to claim 1, wherein measuring Ioutm comprises comparing Ioutm with a reference current.

3. The method according to claim 1, wherein if output voltages of said additional output pass device and said charge pump stage n are equal, then a current ratio (Ioutm/Iout) is equal to a ratio of sizes of said additional output pass device and said charge pump stage n.

4. The method according to claim 1, wherein said additional output pass device comprises an additional output stage.

5. The method according to claim 4, wherein said additional output stage uses identical phase signals as stage n.

6. The method according to claim 1, comprising scaling said additional output pass device down to minimize its size.

7. The method according to claim 1, wherein said additional output pass device comprises a p-n diode.

8. The method according to claim 1, wherein said additional output pass device comprises an n-p diode.

9. The method according to claim 1, wherein said additional output pass device comprises an NMOS transistor, whose source is connected to the output of stage n−1 and whose drain is connected to an input of stage n, and whose gate and source are connected to one another.

10. The method according to claim 1, wherein said additional output pass device comprises a PMOS transistor, whose drain is connected to the output of stage n−1 and whose source is connected to an input of stage n, and whose gate and drain are connected to one another.

11. The method according to claim 1, wherein said additional output pass device comprises an NMOS transistor, whose source is connected to the output of stage n−1 and whose drain is connected to an input of stage n, and whose gate is connected to a control voltage.

12. The method according to claim 1, wherein said additional output pass device comprises a PMOS transistor, whose drain is connected to the output of stage n−1 and whose source is connected to an input of stage n, and whose gate is connected to a control voltage.

13. Circuit architecture for measuring output current (Iout) of a charge pump, comprising:
a charge pump comprising a plurality of n charge pump stages, wherein an output of stage n−1 ($Vo_{n-1}$) is output to stage n, an output voltage of stage n being referred to as charge pump voltage output Vout;
an additional output pass device connected to the output of stage n−1, an output voltage of said additional output pass device being referred to as Voutm;
a first circuit portion for forcing Voutm to be at least approximately equal to Vout and for drawing at least one of output voltage (Voutm) and output current (Ioutm) from the additional output pass device; and
a second circuit portion for measuring Ioutm and correlating Iout with Ioutm.

14. The circuit architecture according to claim 13, wherein if output voltages of said additional output pass device and said charge pump stage n are equal, then a current ratio (Ioutm/Iout) is equal to a ratio of sizes of said additional output pass device and said charge pump stage n.

15. The circuit architecture according to claim 13, wherein said additional output pass device comprises an additional output stage.

16. The circuit architecture according to claim 15, wherein said additional output stage uses identical phase signals as stage n.

17. The circuit architecture according to claim 13, wherein said additional output pass device comprises a p-n diode.

18. The circuit architecture according to claim 13, wherein said additional output pass device comprises an n-p diode.

19. The circuit architecture according to claim 13, wherein said additional output pass device comprises an NMOS transistor, whose source is connected to the output of stage n−1 and whose drain is connected to an input of stage n, and whose gate and source are connected to one another.

20. The circuit architecture according to claim 13, wherein said additional output pass device comprises a PMOS transistor, whose drain is connected to the output of stage n−1 and whose source is connected to an input of stage n, and whose gate and drain are connected to one another.

21. The circuit architecture according to claim 13, wherein said additional output pass device comprises an NMOS transistor, whose source is connected to the output of stage n−1 and whose drain is connected to an input of stage n, and whose gate is connected to a control voltage.

22. The circuit architecture according to claim 13, wherein said additional output pass device comprises a PMOS transistor, whose drain is connected to the output of stage n−1 and whose source is connected to an input of stage n, and whose gate is connected to a control voltage.

* * * * *